(12) United States Patent
Zinn et al.

(10) Patent No.: US 12,016,118 B2
(45) Date of Patent: Jun. 18, 2024

(54) CERAMIC-BASED CIRCUIT BOARD ASSEMBLIES FORMED USING METAL NANOPARTICLES

(71) Applicant: KUPRION INC., San Jose, CA (US)

(72) Inventors: Alfred A. Zinn, Palo Alto, CA (US); Khanh Nguyen, San Jose, CA (US)

(73) Assignee: Kuprion Inc., Waterbury, CT (US)

( * ) Notice: Subject to any disclaimer, the term of this patent is extended or adjusted under 35 U.S.C. 154(b) by 155 days.

(21) Appl. No.: 17/760,079

(22) PCT Filed: Feb. 26, 2021

(86) PCT No.: PCT/US2021/019878
§ 371 (c)(1),
(2) Date: Aug. 3, 2022

(87) PCT Pub. No.: WO2021/178238
PCT Pub. Date: Sep. 10, 2021

(65) Prior Publication Data
US 2023/0065796 A1  Mar. 2, 2023

Related U.S. Application Data

(60) Provisional application No. 62/983,907, filed on Mar. 2, 2020.

(51) Int. Cl.
*H05K 1/09* (2006.01)
*H05K 1/03* (2006.01)
(Continued)

(52) U.S. Cl.
CPC ........... *H05K 1/0306* (2013.01); *H05K 1/092* (2013.01); *H05K 1/115* (2013.01); *H05K 1/181* (2013.01);
(Continued)

(58) Field of Classification Search
CPC ....... H05K 1/0306; H05K 1/092; H05K 3/107
See application file for complete search history.

(56) References Cited

U.S. PATENT DOCUMENTS

| 7,736,414 B1 | 6/2010 | Zinn |
| 8,105,414 B2 | 1/2012 | Zinn |

(Continued)

FOREIGN PATENT DOCUMENTS

| JP | 09153679 A | 6/1997 |
| JP | 2004247334 A | 9/2004 |

(Continued)

OTHER PUBLICATIONS

International Search Report and Written Opinion for PCT/US2021/019878 dated Jun. 15, 2021.

*Primary Examiner* — Sherman Ng
(74) *Attorney, Agent, or Firm* — Carmody Torrance Sandak & Hennessey LLP

(57) ABSTRACT

Printed circuit boards may be formed using ceramic substrates with high thermal conductivity to facilitate heat dissipation. Metal nanoparticles, such as copper nanoparticles, may be used to form conductive traces and fill through-plane vias upon the ceramic substrates. Multi-layer printed circuit boards may comprise two or more ceramic substrates adhered together, wherein each ceramic substrate has one or more conductive traces defined thereon and the one or more conductive traces are formed through consolidation of metal nanoparticles. The one or more conductive traces in a first ceramic substrate layer are in electrical communication with at least one second ceramic substrate layer adjacent thereto.

16 Claims, 3 Drawing Sheets

(51) Int. Cl.
    *H05K 1/11*     (2006.01)
    *H05K 1/18*     (2006.01)
    *H05K 3/10*     (2006.01)
    *H05K 3/30*     (2006.01)
    *H05K 3/40*     (2006.01)
    *H05K 3/46*     (2006.01)

(52) U.S. Cl.
    CPC ............ *H05K 1/183* (2013.01); *H05K 3/107* (2013.01); *H05K 3/303* (2013.01); *H05K 3/4038* (2013.01); *H05K 3/46* (2013.01); *H05K 2201/09227* (2013.01); *H05K 2201/09563* (2013.01)

(56) References Cited

U.S. PATENT DOCUMENTS

| | | | |
|---|---|---|---|
| 8,192,866 | B2 | 6/2012 | Golightly et al. |
| 8,486,305 | B2 | 7/2013 | Zinn et al. |
| 8,834,747 | B2 | 9/2014 | Zinn |
| 9,005,483 | B2 | 4/2015 | Zinn et al. |
| 9,095,898 | B2 | 8/2015 | Zinn |
| 9,700,940 | B2 | 7/2017 | Zinn |
| 10,616,994 | B2 | 4/2020 | Zinn |
| 2011/0214910 | A1* | 9/2011 | Eldridge ............... H05K 3/4647 174/266 |
| 2014/0251667 | A1* | 9/2014 | Granstrom ........ H01L 31/02245 174/262 |
| 2017/0107390 | A1* | 4/2017 | Walker ................... H05K 1/097 |
| 2017/0271173 | A1* | 9/2017 | Ho ............................ C23C 8/02 |
| 2019/0206808 | A1 | 7/2019 | Kasai et al. |
| 2020/0015362 | A1* | 1/2020 | Kuczynski ........... H05K 3/4053 |

FOREIGN PATENT DOCUMENTS

| | | |
|---|---|---|
| JP | 2005159041 A | 6/2005 |
| JP | 2016039332 A | 3/2016 |

* cited by examiner

CERAMIC-BASED CIRCUIT BOARD ASSEMBLIES FORMED USING METAL NANOPARTICLES

STATEMENT REGARDING FEDERALLY SPONSORED RESEARCH OR DEVELOPMENT

This invention was made with government support under project number DE-SC0020758 awarded by U.S. Department of Energy. The government has certain rights in the invention.

BACKGROUND

Most electronics made today are fabricated using printed circuit board (PCB) technology. The term "printed circuit board" is somewhat of a misnomer, since most boards are not truly printed and instead utilize photolithography to pattern a desired conductive circuit pattern from a copper sheet. The copper sheet is first bonded to a glass fiber epoxy laminate (substrate), such as FR4, and then much of the copper is etched away using potentially toxic and corrosive chemicals to leave behind one or more conductive traces upon the substrate. Up to 90% of the copper sheet may be etched away in this process. Although the etched copper may be recovered, the etching process is time-consuming and labor-intensive. Most printed circuit boards are multi-layered, and this process is repeated for each board layer, with bonding between the individual board layers taking place after fabrication, such as through hot-pressing. The hot-pressing operation may result in misalignment, warping, deformation, thermomechanical stress, and/or the like if not performed carefully, especially for thermally sensitive substrates.

Electrical communication between the various board layers may be established using vias extending vertically through the plane of the substrate. Filling of the vias with a conductive metal, such as copper, takes place separately from forming the conductive traces though copper etching, usually using time-consuming electroplating processes. Thus, in conventional board fabrication techniques, conductive traces may be formed subtractively and vias may be filled additively. The diameter of the vias may be severely limited when using electroplating processes, since electroplating processes are unable to fill large-diameter vias fully over commercially useful plating times (10-12 hours). As an additional difficulty, blind vias and hidden vias may need to be fabricated and filled separately from vias extending through the substrate.

PCBs and similar circuit boards are thermal insulators by the very nature of their construction, given the thermally insulating nature of substrates like FR4 and other glass fiber epoxy composites. The thermal conductivity value of FR4 and similar substrates is ~0.1-0.3 W/m·K. The low thermal conductivity of PCB substrates can make removal of excess heat rather difficult, especially when circuitry and/or electronic components are embedded in the board itself to save space, thereby necessitating that the substrate facilitate heat transfer to an appropriate heat sink. Very little excess heat is capable of being transferred via leads, circuitry and vias due to their small size. Even thermal vias may be insufficient. In addition, thermal dissipation through a heat sink is usually only possible from one side of the circuit board in conventional multi-layer PCBs. As an additional difficulty, glass fiber epoxy composites, such as FR4, may undergo deformation while fabricating a multi-layer PCB, and long bake-out times may be needed to fully cure an adhesive bonding various board layers together.

Given the foregoing, FR4 and similar glass fiber epoxy composites are increasingly becoming inadequate for fabricating modern electronic devices due to their growing power demands. Ineffective heat dissipation may lead to overheating, reduced conduction, higher power requirements than normal, and/or the need for clock-down operation to avoid board burnout and device failure. Due to the multi-level nature of many modern electronic devices, replacement of a failed component can be rather problematic or even impossible due to lack of accessibility. While these issues are problematic in many operational environments, they can be exacerbated even further in space, wherein there is no surrounding atmosphere through which to passively dissipate excess heat in the form of convection. Radiator structures may oftentimes be about 100° C. or below the temperature of a heat-producing device due to inadequate heat transfer at a junction thereto. Therefore, improved printed circuit board architectures facilitating improved heat transfer may be highly desirable, such as to increase radiator/heat sink efficiencies, decrease radiator/heat sink sizes, and facilitating increased payload capabilities for payload-sensitive operations.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and the benefit of this disclosure.

In FIG. 5B, a non-printed electronic component bridges the gap in FIG. 5A, thereby establishing electrical communication with each portion of the conductive trace.

DETAILED DESCRIPTION

Figure 1:
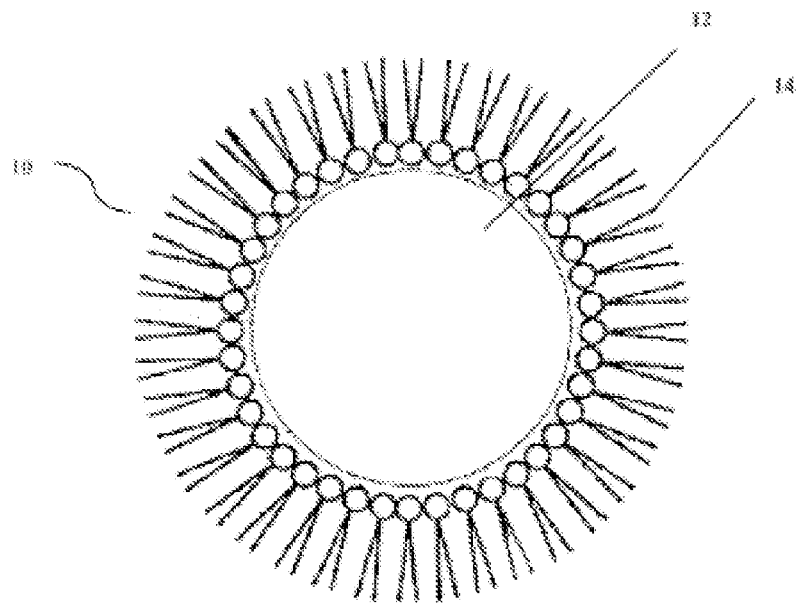
FIGS. 1 and 2 are diagrams of presumed structures of metal nanoparticles having a surfactant coating thereon.

The present disclosure is generally directed to printed circuit board technology and, more specifically, printed circuit boards (PCBs) and related electronic systems formed upon highly thermally conductive ceramic substrates, particularly multi-layer PCBs.

As discussed above, removal of excess heat from printed circuit boards and related electronic assemblies can be problematic due to low thermal conductivity of the glass fiber epoxy composites commonly used in their manufacture, such as FR4. Ineffective heat transfer can have a number of significant consequences when operating an electronic device. Multi-layer PCBs employing glass fiber epoxy composites may also be especially difficult to fabricate due to ineffective thermal communication through the substrate layers, as well as warping and similar problems resulting from excess heat. In addition, to achieve effective outgassing and moisture removal during manufacture of multi-layer PCBs, long-term thermal treatment (bake-out) may be needed, oftentimes 1000 hours or more. As such, substrates having poor thermal conductivity, such as FR4 and similar glass fiber epoxy composites, are becoming increasingly ineffective for use in complex and high-performance PCBs, particularly multi-layer PCBs.

In the present disclosure, printed circuit boards fabricated upon highly thermally conductive ceramic substrates are described, such as AlN (thermal conductivity up to 260 W/m·K) and SiN (thermal conductivity up to 90 W/m·K), both of which are electrically insulating. Use of such thermally conductive substrates may allow a three-order-of-magnitude increase in thermal conduction to be realized over that afforded by FR4 and similar substrates, which may significantly decrease or even eliminate the need for vias solely dedicated to thermal conduction (thermal vias) in printed circuit boards. If thermal vias are still warranted in a particular application, however, they may be easily accommodated in the disclosure herein.

To accommodate the use of such ceramic substrates, metal nanoparticle compositions may be utilized to directly print conductive traces upon one or more surfaces of the ceramic substrates and simultaneously fill any vias that are present. This approach represents a paradigm shift from conventional subtractive techniques for forming conductive traces and additive techniques for filling vias when manufacturing PCBs. Filling of vias with metal nanoparticles and conversion to bulk metal therein may establish electrical communication between adjacent layers of a multi-layer PCB, specifically between the one or more conductive traces present thereon. Copper nanoparticles may be particularly suitable for forming conductive traces and filling vias due to the high electrical conductivity of metallic copper and the low cost of this metal.

As discussed in greater detail hereinbelow, copper nanoparticles and other metal nanoparticles may be consolidated to form bulk metal at low processing temperatures, thereby facilitating direct printing of conductive traces and similar PCB features and providing significant advantages over copper-based etching and electroplating procedures currently utilized in conventional PCB manufacturing techniques. Printed ceramic layers produced according to the disclosure herein may be fabricated individually and then become adhered together to form a multi-layer PCB, wherein the number of layers is not particularly limited. Advantageously, conventional adhesives may be utilized for this purpose, while avoiding the processing difficulties associated with glass fiber epoxy composites and similar substrates conventionally used for forming PCBs. Additional advantages of ceramics include, for example, minimal moisture absorption into the board, and limited warping and delamination due to the nature of the ceramic materials. The minimal moisture absorption and limited outgassing may be particularly advantageous compared to the extended bake-out times often employed with glass fiber epoxy composites, such as employed for PCBs used in space vehicle or probe applications. Thus, the high thermal stability and thermal conductivity of ceramic substrates may improve both the manufacturing and operational performance of PCBs, which may be aided further still through the use of metal nanoparticles.

Further, additional electronic components (passive or active) may be direct-printed onto the conductive traces in the same processing step (e.g., by aerosol printing) in which the conductive traces are formed, or non-printed electronic components may be direct bonded to and/or embedded within the PCBs in electrical communication with at least one conductive trace. This feature may further simplify the PCB manufacturing process, as well as facilitate incorporation of electronic components that may not otherwise be satisfactorily incorporated. The high thermal conductivity of the ceramic substrates may promote good heat dissipation for the electronic components, thereby preventing premature burnout, as well as any parts that are bonded to an outer surface of the PCB, which may multiply the thermal dissipation capabilities over those afforded by FR4 and similar glass fiber epoxy composites.

Passive components (e.g., termination resistors and by-pass capacitors) may be readily direct-printed onto ceramic substrates via aerosol printing, as a non-limiting example. Passive component fabrication may take place simultaneously with conductive trace fabrication in some instances. Alternately, standard (non-printed) electronic components may be directly bonded to a conductive trace to establish electrical communication therewith. In some instances, bonding to the conductive traces may be accomplished using a suitable metal nanoparticle paste composition, such as a copper nanoparticle paste composition or through wire bonding techniques employing metal nanoparticles. Non-printed electronic components may also be located in suitable cavities or spaces formed (e.g., machined) in the ceramic substrates to accommodate their size, thereby greatly reducing the board area and component assembly complexity. When located in a cavity within the ceramic substrates, the non-printed electronic components may again be in electrical communication with at least one conductive trace. The high thermal conductivity of the ceramic substrates may allow for a previously unimaginable level of complex component integration into PCBs, thereby providing capabilities not previously available in PCB manufacturing. Direct bonding of standard electronic components is not usually an available option in current PCB manufacturing using conventional solder materials, such as lead-based solders, since the solder materials may reflow during hot-pressing operations to adhere multiple substrate layers together to form a multi-layer PCB. Thus, the present disclosure advantageously allows heterogeneous, multi-layer board integration to be realized in PCB manufacturing. In non-limiting embodiments, incorporation of standard electronic components into a conductive trace may be accomplished by leaving a gap in the conductive trace and then filling (bridging) the gap with the standard electronic component. Metal nanoparticles (e.g., copper nanoparticles) or a conductive adhesive may be used to adhere the electronic component to the conductive trace and establish electrical communication therewith.

Multi-layer PCBs of the present disclosure may be formed by fabricating each board layer individually upon a ceramic substrate and then forming the multi-layer PCB by laying up and bonding the individual board layers together. Conventional adhesives may be utilized for this purpose. Via filling and printing conductive traces with metal nanoparticles (e.g., copper nanoparticles) may take place integrally at largely the same time before bonding the board layers together, thereby facilitating rapid manufacturing by producing the individual board layers in parallel. Manufacturing PCBs in this manner may allow any number of board layers to be stacked upon one another after forming the board layers in a modular fashion. Bonding of the individual layers together in the multi-layer PCBs disclosed herein may take place all at one time, in some embodiments, irrespective of the number of layers, thereby avoiding the multiple hot-pressing operations needed when using glass fiber epoxy composites to construct a multi-layer PCB by gradually building up the layers. Each layer of the multi-layer PCBs disclosed herein may have a tailored functionality and/or a differing level of complexity or functionality relative to other board layers. Current multi-layer PCBs may have similar functionality across the various board layers, since a single layer does not provide enough space to incorporate a desired extent of functionality.

Metal nanoparticles within conductive traces and/or vias may be consolidated with one another before adhering the various board layers together, or the metal nanoparticles may remain unconsolidated and undergo simultaneous or substantially simultaneous consolidation as the board layers become adhered together. In the first process configuration, the various board layers may be finished and stockpiled. Simultaneous consolidation of the metal nanoparticles within the various board layers may be advantageous from the standpoint of performing fewer consolidation operations, although stockpiling may be somewhat less feasible in this case. When metal nanoparticle consolidation is performed in conjunction with adhering various board layers together, stencil printing, particularly into grooves or channels upon the ceramic substrate and into vias, optionally with partial curing taking place prior to laying up the various board layers with one another, may be particularly advantageous for retaining the metal nanoparticles in place in a desired substrate location prior to undergoing consolidation during a laying up process. An adhesive layer may further hold the metal nanoparticles in place, if needed.

Accordingly, advantages of multi-layer PCBs of the present disclosure include, but are not limited to, high thermal conductivity facilitated by the ceramic substrate, large-scale manufacturing capabilities at reasonable cost, modular layer fabrication, low-temperature processing to form conductive traces and filled vias, ability to attach standard electronic components, widespread material availability, thermal stability, mechanical strength, and flexibility to fabricate a multi-layer PCB either modularly or in a concerted fashion by consolidating metal nanoparticles to make multiple conductive traces and electrical interconnects at the same time. Further, thin-layer ceramic substrates are feasible and available (200 microns or less) for decreasing the thickness of multi-layer PCB architectures.

Conductive traces within buried layers of a multi-level PCB need not necessarily be bonded to the ceramic substrate or otherwise encapsulated, since adjacent PCB layers may aid in retaining the conductive traces in place and protecting against oxidation. As such, a bonding layer may often be omitted in many instances when forming conductive traces upon a ceramic substrate according to the disclosure herein. Incomplete or weak bonding of the conductive traces to a ceramic substrate may also be desirable in many instances to accommodate expansion and contraction during thermal cycling, thereby increasing reliability and product lifetime. A conformal layer to protect conductive traces against oxidation may be employed, if needed. Conductive traces upon an outer layer of a multi-level PCB, in particular, may be bonded or encapsulated, such as with a mask layer or similar feature, to preclude oxidation and to prevent unbonded conductive traces from falling off the ceramic substrate or shifting in position. To promote conductive trace adherence, a bonding layer or adhesive layer may utilized. Some metal nanoparticles (e.g., Ti, Cr, and V) may readily bond to the ceramic substrates disclosed and also facilitate adherence of conductive traces thereon. For example, such metal nanoparticles may be used to form a bonding layer for promoting more robust adherence of copper nanoparticles to form a conductive trace upon a ceramic substrate. Alternately, ceramic substrates may be obtained or formed with a suitable bonding layer already present thereon prior to forming a conductive trace according to the disclosure herein. Further alternately, bonding of conductive traces may be accomplished using a conventional epoxy adhesive first deposited onto the ceramic substrate and cured, with metal nanoparticles being subsequently deposited to form a conductive trace upon the cured adhesive. Thus, the manner in which a conductive trace is disposed upon a particular ceramic substrate may vary from application to application and the location where the ceramic substrate is placed in a multi-layer PCB.

Metal nanoparticles are uniquely qualified for the applications described herein due to the moderate processing conditions needed for consolidating the metal nanoparticles together into the corresponding bulk metal. Namely, as described in further detail below, metal nanoparticles can be consolidated (fused) together into the corresponding bulk metal under a range of mild processing conditions that are significantly below the melting point of the metal itself. Due to copper's high electrical and thermal conductivity and relatively low cost, copper nanoparticles can be a particularly desirable type of metal nanoparticle for use in the various embodiments of the present disclosure. Once formed into bulk metal within a conductive trace or filled via, the bulk metal may be compatible with high-temperature processing conditions made possible through use of the ceramic substrates disclosed herein. Thus, metal nanoparticles and ceramic substrates may afford particular synergy when used for forming PCBs according to the disclosure herein.

In addition to their advantageous low processing temperatures, particularly suitable metal nanoparticle compositions may be tailored to limit shrinkage during fusion, which may exceed 20% in other metal nanoparticle systems, and limit thermal expansion to reduce thermomechanical stress during operational hot-cold cycling. More specifically, metal nanoparticle compositions may contain larger micron-sized, highly thermally conductive particles (e.g., copper, aluminum, boron nitride, aluminum nitride, silicon nitride, silicon carbide, carbon fibers, diamond, carbon nanotubes, graphene, and the like) while still being easily dispensed by various deposition techniques. These features may greatly simplify PCB assembly and provide overall product cost reduction while significantly enhancing performance and robustness. Once metal nanoparticle consolidation occurs, the resulting bulk metal binds the micron-scale additives together to form a monolithic metal body defining an electrically conductive pathway (conductive trace).

As used herein, the term "metal nanoparticle" refers to metal particles that are about 150 nm or less in size, preferably about 100 nm or less in size, without particular reference to the shape of the metal particles.

As used herein, the term "micron-scale metal particles" refers to metal particles that are about 100 nm or greater in size in at least one dimension.

The terms "consolidate," "consolidation" and other variants thereof are used interchangeably herein with the terms "fuse," "fusion" and other variants thereof.

As used herein, the terms "partially fused," "partial fusion," and other derivatives and grammatical equivalents thereof refer to the partial coalescence of metal nanoparticles with one another. Whereas totally fused metal nanoparticles retain only minimal structural morphology of the original unfused metal nanoparticles (i.e., they resemble a dense, bulk metal state with significant grain boundaries in the 100-500 nm size range), partially fused metal nanoparticles retain at least some of the structural morphology of the original unfused metal nanoparticles, such as a higher level of porosity, a smaller average grain size and crystal domain size, and a significant number of grain boundaries. The properties of partially fused metal nanoparticles can be intermediate between those of the corresponding bulk metal and the original unfused metal nanoparticles. In some embodiments, fully dense (non-porous) bulk metal can be obtained following nanoparticle consolidation. In other embodiments, the bulk metal can have less than about 10% porosity, or less than about 20% porosity, or less than about 30% porosity in an amount above full densification (i.e., >0% porosity). Thus, in particular embodiments, the bulk metal resulting from metal nanoparticle consolidation may have a porosity ranging from about 2% to about 30%, or about 2% to about 5%, or about 5% to about 10%, or about 10% to about 15%, or about 15% to about 20%, or about 20% to about 25%, or about 25% to about 30%. In a particular example, consolidated copper nanoparticles may have a uniform porosity of about 12% and exhibit a thermal conductivity of 289 W/m·K. The nanoporosity may range from about 2% to about 15% (i.e., 85%-98% dense fused copper nanoparticles with closed pore nanoporosity having a pore size ranging from about 50 nm to about 500 nm, or about 100 nm to about 300 nm, or about 150 nm to about 250 nm). Nanoporosity in this range may afford ductility and stable deformation (flexibility) during extreme thermal cycling operations, thereby decreasing a risk of failure during PCB manufacture.

Before further discussing more particular aspects of the present disclosure in more detail, additional brief description of metal nanoparticles and their processing conditions, particularly copper nanoparticles, will first be provided. Copper nanoparticles may be used in any of the embodiments disclosed herein. Metal nanoparticles exhibit a number of properties that can differ significantly from those of the corresponding bulk metal. One property of metal nanoparticles that can be of particular importance for processing according to the disclosure herein is nanoparticle fusion (consolidation) that occurs at the metal nanoparticles' fusion temperature. As used herein, the term "fusion temperature" refers to the temperature at which a metal nanoparticle liquefies, thereby giving the appearance of melting. As used herein, the terms "fusion" and "consolidation" synonymously refer to the coalescence or partial coalescence of metal nanoparticles with one another to form a larger mass comprising bulk metal. Accordingly, there is at least partial connectivity between the metal nanoparticles following heating above the fusion temperature. The bulk metal resulting from metal nanoparticle fusion may have an electrical and thermal conductivity approaching that of cast bulk metal.

Upon decreasing in size, particularly below about 20 nm in equivalent spherical diameter, the temperature at which metal nanoparticles liquefy drops dramatically from that of the corresponding bulk metal. For example, copper nanoparticles having a size of about 20 nm or less can have fusion temperatures of about 235° C. or below, or about 220° C. or below, or about 200° C. or below, in comparison to bulk copper's melting point of 1083° C. Thus, the consolidation of metal nanoparticles taking place at the fusion temperature can allow structures containing bulk metal to be fabricated at significantly lower processing temperatures than when working directly with the bulk metal itself as a starting material. Processing conditions for consolidating metal nanoparticles are typically within normal PCB manufacturing parameters of around 375° F. and 275-400 psi. Pressure is not necessarily needed to promote fusion, unlike the processing conditions of epoxy-based PCBs, but may desirably promote formation of denser metal bodies within conductive traces, vias, and the like, up to 100% density. Accordingly, the use of metal nanoparticles according to the disclosure herein, such as copper nanoparticles, does not require development of alternative fabrication lines or materials differing from those conventionally used in PCB manufacturing.

A number of scalable processes for producing bulk quantities of metal nanoparticles in a targeted size range have been developed. Most typically, such processes for producing metal nanoparticles take place by reducing a metal precursor in the presence of one or more surfactants. The metal nanoparticles can then be isolated and purified from the reaction mixture by common isolation techniques and processed into a formulation suitable for dispensation.

Any suitable technique can be employed for forming the metal nanoparticles used in the disclosure herein. Particularly facile metal nanoparticle fabrication techniques are described in U.S. Pat. Nos. 7,736,414, 8,105,414, 8,192,866, 8,486,305, 8,834,747, 9,005,483, 9,095,898, and 9,700,940, each of which is incorporated herein by reference in its entirety. As described therein, metal nanoparticles can be fabricated in a narrow size range by reduction of a metal salt in a solvent in the presence of a suitable surfactant system, which can include one or more different surfactants. Further description of suitable surfactant systems follows below. Without being bound by any theory or mechanism, it is believed that the surfactant system can mediate the nucleation and growth of the metal nanoparticles, limit surface oxidation of the metal nanoparticles, and/or inhibit metal nanoparticles from extensively aggregating with one another prior to being at least partially fused together. Suitable organic solvents for solubilizing metal salts and forming metal nanoparticles can include, for example, formamide, N,N-dimethylformamide, dimethyl sulfoxide, dimethylpropylene urea, hexamethylphosphoramide, tetrahydrofuran, glyme, diglyme, triglyme, tetraglyme, proglyme, or polyglyme. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or tetraalkylammonium borohydrides).

Figure 2:
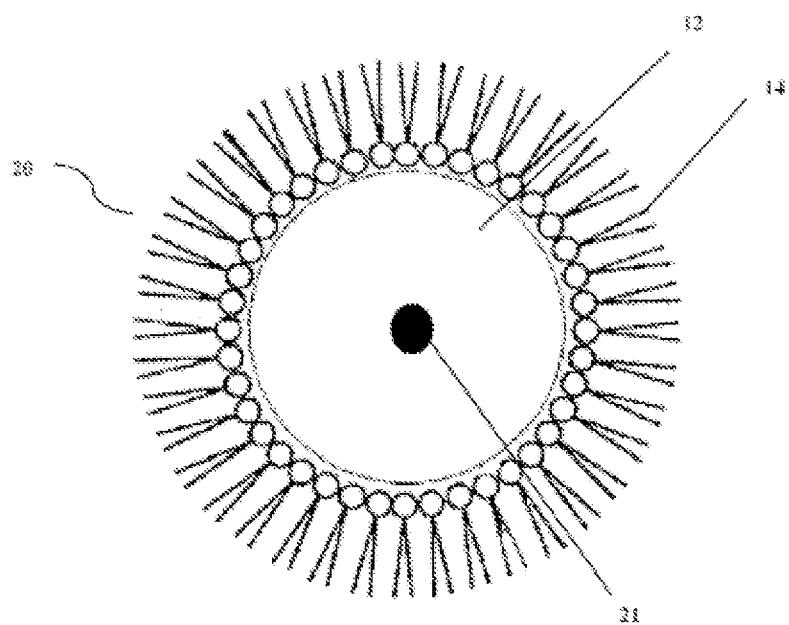

FIGS. 1 and 2 show diagrams of presumed structures of metal nanoparticles having a surfactant coating thereon. As shown in FIG. 1, metal nanoparticle 10 includes metallic core 12 and surfactant layer 14 overcoating metallic core 12. Surfactant layer 14 can contain any combination of surfactants, as described in more detail below. Metal nanoparticle 20, shown in FIG. 2, is similar to that depicted in FIG. 1, except metallic core 12 is grown about nucleus 21, which can be a metal that is the same as or different than that of metallic core 12. Because nucleus 21 is buried deep within metallic core 12 in metal nanoparticle 20 and is very small in size, it is not believed to significantly affect the overall nanoparticle properties. Nucleus 21 may comprise a salt or a metal, wherein the metal may be the same as or different than that present in metallic core 12. In some embodiments, the nanoparticles can have an amorphous morphology.

As discussed above, the metal nanoparticles have a surfactant coating containing one or more surfactants upon their surface. The surfactant coating can be formed on the metal nanoparticles during their synthesis. The surfactant coating is generally lost during consolidation of the metal nanoparticles upon heating above the fusion temperature, which results in formation of bulk metal over a range of nanoporosity values, according to the embodiments of the present disclosure. Formation of a surfactant coating upon metal nanoparticles during their syntheses can desirably limit the ability of the metal nanoparticles to fuse to one another prematurely, limit agglomeration of the metal nanoparticles, and promote the formation of a population of metal nanoparticles having a narrow size distribution. Porosity values may range from 2-30%, which may be tailored based upon a number of factors, including the type of surfactant(s) that are present and the consolidation conditions.

The types of metal nanoparticles suitable for use in conjunction with the various embodiments of the present disclosure are not believed to be particularly limited. Suitable metal nanoparticles can include, but are not limited to, tin nanoparticles, copper nanoparticles, aluminum nanoparticles, palladium nanoparticles, silver nanoparticles, gold nanoparticles, iron nanoparticles, cobalt nanoparticles, nickel nanoparticles, titanium nanoparticles, zirconium nanoparticles, hafnium nanoparticles, tantalum nanoparticles, and the like. Micron-sized particles of these metals can be present in metal nanoparticle paste compositions containing the metal nanoparticles as well. Copper can be a particularly desirable metal for use in the embodiments of the present disclosure due to its low cost, strength, and excellent electrical and thermal conductivity values (second highest of all metals).

In various embodiments, the surfactant system present within the metal nanoparticles can include one or more surfactants. The differing properties of various surfactants can be used to tailor the properties of the metal nanoparticles. Factors that can be taken into account when selecting a surfactant or combination of surfactants for inclusion upon the metal nanoparticles can include, for example, ease of surfactant dissipation from the metal nanoparticles during nanoparticle fusion, nucleation and growth rates of the metal nanoparticles, the metal component of the metal nanoparticles, and the like.

In some embodiments, an amine surfactant or combination of amine surfactants, particularly aliphatic amines, can be present upon the metal nanoparticles. Amine surfactants can be particularly desirable for use in conjunction with copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure during synthesis versus having ready volatility and/or ease of handling during nanoparticle consolidation. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-hexylamine, n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but be readily dissociable therefrom during metal nanoparticle consolidation.

In some embodiments, the surfactant system can include a secondary amine. Secondary amines suitable for forming metal nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic. Without being bound by any theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for inclusion upon metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with metal nanoparticles can be envisioned by one having ordinary skill in the art.

Suitable pyridines can include both pyridine and its derivatives. Illustrative pyridines that can be suitable for use inclusion upon metal nanoparticles include, for example, pyridine, 2-methylpyridine, 2,6-dimethylpyridine, collidine, pyridazine, and the like. Chelating pyridines such as bipyridyl chelating agents may also be used. Other pyridines that can be used in conjunction with metal nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be present upon metal nanoparticles include, for example, trimethylphosphine, triethylphosphine, tributylphosphine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used. Illustrative chelating phosphines can include 1,2-bisphosphines, 1,3-bisphosphines, and bis-phosphines such as BINAP, for example. Other phosphines that can be used in conjunction with metal nanoparticles can be envisioned by one having ordinary skill in the art.

Suitable thiols can have a formula of RSH, where R is an alkyl or aryl group having from about 4 to about 16 carbon atoms. Illustrative thiols that can present upon metal nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with metal nanoparticles can be envisioned by one having ordinary skill in the art.

As mentioned above, a distinguishing feature of metal nanoparticles is their low fusion temperature. In order to facilitate deposition of metal nanoparticles and ready consolidation thereof, the metal nanoparticles may be formulated in a paste or similar composition suitable for controlled deposition and fusion. Additional disclosure directed to metal nanoparticle paste compositions and similar formulations follows hereinbelow.

Metal nanoparticle paste compositions or similar formulations can be prepared by dispersing as-produced or as-isolated metal nanoparticles in an organic matrix containing one or more organic solvents and various other optional components. As used herein, the terms "nanoparticle paste formulation," "nanoparticle paste composition" and grammatical equivalents thereof are used interchangeably and refer synonymously to a fluid composition containing dispersed metal nanoparticles that is suitable for dispensation using a desired technique. Use of the term "paste" does not necessarily imply an adhesive function of the paste alone. Through judicious choice of the organic solvent(s) and other additives, the loading of metal nanoparticles and the like, ready dispensation of the metal nanoparticles may be promoted. Paste formulations used for printing conductive traces and filling vias may be the same or different, wherein, if different, the paste formulations may be adapted for forming each type of conductive structure.

Cracking can sometimes occur during consolidation of the metal nanoparticles. One way in which the nanoparticle paste compositions of the present disclosure can promote a decreased degree of cracking and void formation following metal nanoparticle consolidation is by maintaining a high solids content. More particularly, in some embodiments, the nanoparticle paste compositions can contain at least about 30% metal nanoparticles by weight, particularly about 30% to about 98% metal nanoparticles by weight of the paste composition, or about 50% to about 95% metal nanoparticles by weight of the paste composition, or about 70% to about 98% metal nanoparticles by weight of the paste composition. Moreover, in some embodiments, small amounts (e.g., about 0.01% to about 15% or about 35% or about 60% by weight of the paste composition) of micron-scale metal particles can be present in addition to the metal nanoparticles. Such micron-scale metal particles can desirably promote the fusion of metal nanoparticles into bulk metal and further reduce the incidence of cracking. Instead of being liquefied and undergoing direct consolidation as is the case for the metal nanoparticles, the micron-scale metal particles can simply become joined together upon being contacted with liquefied metal nanoparticles that have been raised above their fusion temperature. These factors can reduce the porosity that results after fusing the metal nanoparticles together. The micron-scale metal particles can contain the same or different metals than the metal nanoparticles, and suitable metals for the micron-scale particles can include, for example, copper, silver, gold, aluminum, tin, and the like. Micron-scale graphite particles may also be included, in some embodiments. Carbon nanotubes, diamond particles, and/or graphene may be included, in some embodiments. The foregoing micron-scale additives may increase mechanical strength and function as crack deflectors to prevent propagation of cracks during use.

Decreased cracking and void formation during metal nanoparticle consolidation can also be promoted by judicious choice of the solvent(s) forming the organic matrix. A tailored combination of organic solvents can desirably decrease the incidence of cracking and void formation. More particularly, an organic matrix containing one or more hydrocarbons (saturated, monounsaturated, polyunsaturated (2 or more double bonds) or aromatic), one or more alcohols, one or more amines, and one or more organic acids can be especially effective for this purpose. One or more esters and/or one or more anhydrides may be included, in some embodiments. Without being bound by any theory or mechanism, it is believed that this combination of organic solvents can facilitate the removal and sequestration of surfactant molecules surrounding the metal nanoparticles during consolidation, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

Further tailoring of the solvent composition can be performed to reduce the suddenness of volume contraction that takes place during surfactant removal and metal nanoparticle consolidation. Specifically, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In various embodiments, at least some of the one or more organic solvents can have a boiling point of about 100° C. or greater. In other various embodiments, at least some of the one or more organic solvents can have a boiling point of about 200° C. or greater. In some or other embodiments, the one or more organic solvents can have boiling points ranging between about 50° C. and about 200° C., or between about 50° C. and about 250° C., or between about 50° C. and about 300° C., or between about 50° C. and about 350° C. Use of high boiling organic solvents can desirably increase the pot life of the metal nanoparticle paste compositions and limit the rapid loss of solvent, which can lead to cracking and void formation during metal nanoparticle consolidation. In some embodiments, at least one of the organic solvents can have a boiling point that is higher than the boiling point(s) of the surfactant(s) associated with the metal nanoparticles. Accordingly, surfactant(s) can be removed from the metal nanoparticles by evaporation before removal of the organic solvent(s) takes place.

In some embodiments, the organic matrix can contain one or more alcohols, which may be $C_2$-$C_{12}$, $C_4$-$C_{12}$ or $C_7$-$C_{12}$ in more particular embodiments. In various embodiments, the alcohols can include monohydric alcohols, diols, or triols. One or more glycol ethers (e.g., diethylene glycol and triethylene glycol), alkanolamines (e.g., ethanolamine, triethanolamine, and the like), or any combination thereof may be present in certain embodiments, which may be present alone or in combination with other alcohols. Various glymes may be present with the one or more alcohols in some embodiments. In some embodiments, one or more hydrocarbons can be present in combination with one or more alcohols. As discussed above, it is believed that alcohol (and optionally glymes and alkanolamines) and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), diisopropyleneglycol monomethyl ether, diethyleneglycol diethyl ether, 2-propanol, 2-butanol, t-butanol, 1-hexanol, 2-(2-butoxyethoxy)ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines (CAS 68526-63-6), alkyl ($C_{10}$-$C_{16}$) dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the nanoparticle paste compositions include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

In some embodiments, the organic matrix can include more than one hydrocarbon, more than one alcohol, optionally more than one glyme (glycol ether), more than one amine, and more than one organic acid. For example, in some embodiments, each class of organic solvent can have two or more members, or three or more members, or four or more members, or five or more members, or six or more members, or seven or more members, or eight or more members, or nine or more members, or ten or more members. Moreover, the number of members in each class of organic solvent can be the same or different. Particular benefits of using multiple members of each class of organic solvent are described hereinafter.

One particular advantage of using multiple members within each class of organic solvent can include the ability to provide a wide spread of boiling points in the metal nanoparticle paste compositions. By providing a wide spread of boiling points, the organic solvents can be removed gradually as the temperature rises while affecting metal nanoparticle consolidation, thereby limiting volume contraction and disfavoring cracking. By gradually removing the organic solvent in this manner, less temperature control may be needed to affect slow solvent removal than if a single solvent with a narrow boiling point range was used. In some embodiments, the members within each class of organic solvent can have a window of boiling points ranging between about 50° C. and about 200° C., or between about 50° C. and about 250° C., or between about 100° C. and about 200° C., or between about 100° C. and about 250° C., or between about 150° C. and about 300° C., or between about 150° C. and about 350° C. In more particular embodiments, the various members of each class of organic solvent can each have boiling points that are separated from one another by at least about 20° C., specifically about 20° C. to about 50° C. More specifically, in some embodiments, each hydrocarbon can have a boiling point that differs by about 20° C. to about 50° C. from other hydrocarbons in the organic matrix, each alcohol can have a boiling point that differs by about 20° C. to about 50° C. from other alcohols in the organic matrix, each amine can have a boiling point that differs by about 20° C. to about 50° C. from other amines in the organic matrix, and each organic acid can have a boiling point that differs by about 20° C. to about 50° C. from other organic acids in the organic matrix. The more members of each class of organic solvent that are present, the smaller the differences become between the boiling points. By having smaller differences between the boiling points, solvent removal can be made more continual, thereby limiting the degree of volume contraction that occurs at each stage. A reduced degree of cracking can occur when four to five or more members of each class of organic solvent are present (e.g., four or more hydrocarbons, four or more alcohols, four or more amines, and four or more organic acids; or five or more hydrocarbons, five or more alcohols, five or more amines, and five or more organic acids), each having boiling points that are separated from one another within the above range.

In various embodiments, the metal nanoparticles used in the metal nanoparticle paste compositions can be about 20 nm or less in size. In other various embodiments, metal nanoparticles may be up to about 75 nm in size. As discussed above, metal nanoparticles in a 20 nm and under size range have fusion temperatures that are significantly lower than those of the corresponding bulk metal and readily undergo consolidation with one another as a result. In some embodiments, metal nanoparticles that are about 20 nm or less in size can have a fusion temperature of about 220° C. or below (e.g., a fusion temperature in the range of about 140° C. to about 220° C.) or about 200° C. or below, which can provide advantages that are noted above. Copper nanoparticles may have a fusion temperature within these ranges. In some embodiments, at least a portion of the metal nanoparticles can be about 10 nm or less in size, or about 5 nm or less in size. In more specific embodiments, at least a portion of the metal nanoparticles can range from about 1 nm in size to about 20 nm in size, or from about 1 nm in size and about 10 nm in size, or from about 1 nm in size to about 5 nm in size, or from about 3 nm in size to about 7 nm in size, or from about 5 nm in size to about 20 nm in size. In some embodiments, substantially all of the metal nanoparticles can reside within these size ranges. In some embodiments, larger metal nanoparticles can be combined in the metal nanoparticle paste compositions with metal nanoparticles that are about 20 nm in size or less. For example, in some embodiments, metal nanoparticles ranging from about 1 nm to about 10 nm in size can be combined with metal nanoparticles that range from about 25 nm to about 50 nm in size, or with metal nanoparticles that range from about 25 nm to about 100 nm in size, or with metal nanoparticles that range from about 25 nm to about 150 nm in size, or about 50 nm to about 150 nm in size. As further discussed below, micron-scale metal particles and/or nanoscale particles can also be included in the metal nanoparticle paste compositions in some embodiments. Although larger metal nanoparticles and micron-scale metal particles may not be liquefiable at the low temperatures of their smaller counterparts, they can still become consolidated upon contacting the smaller metal nanoparticles that have been liquefied at or above their fusion temperature, as generally discussed above.

In addition to metal nanoparticles and organic solvents, other additives can also be present in the metal nanoparticle paste compositions. Such additional additives can include, for example, rheology control aids, thickening agents, micron-scale conductive additives, nanoscale conductive additives, and any combination thereof. Chemical additives can also be present. As discussed hereinafter, the inclusion of micron-scale conductive additives, such as micron-scale metal particles, can be particularly advantageous. Nanoscale or micron-scale diamond or other thermally conductive additives may be desirable to include in some instances for promoting more efficient heat transfer.

In some embodiments, the paste compositions can contain about 0.01% to about 15% micron-scale metal particles by weight, or about 1% to about 10% micron-scale metal particles by weight, or about 1% to about 5% micron-scale metal particles by weight, or about 0.1% to about 35% micron-scale metal particles by weight. Inclusion of micron-scale metal particles in the metal nanoparticle paste compositions can desirably reduce the incidence of cracking that occurs during consolidation of the metal nanoparticles when forming a bulk metal. Without being bound by any theory or mechanism, it is believed that the micron-scale metal particles can become consolidated with one another as the metal nanoparticles are liquefied and form a transient liquid coating upon the surface of the micron-scale metal particles. In some embodiments, the micron-scale metal particles can range from about 500 nm to about 100 microns in size in at least one dimension, or from about 500 nm to about 10 microns in size in at least one dimension, or from about 100 nm to about 5 microns in size in at least one dimension, or from about 100 nm to about 10 microns in size in at least one dimension, or from about 100 nm to about 1 micron in size in at least one dimension, or from about 1 micron to about 10 microns in size in at least one dimension, or from about 5 microns to about 10 microns in size in at least one dimension, or from about 1 micron to about 100 microns in size in at least one dimension. The micron-size metal particles can contain the same metal as the metal nanoparticles or contain a different metal. Thus, metal alloys can be fabricated by including micron-size metal particles in the nanoparticle paste compositions with a metal differing from that of the metal nanoparticles. Metal alloys may also be formed by combining different types of metal nanoparticles with one another. Suitable micron-scale metal particles can include, for example, Cu, Ni, Al, Fe, Co, Mo, Ag, Zn, Sn, Au, Pd, Pt, Ru, Mn, Cr, Ti, V, Mg or Ca particles. Non-metal particles such as, for example, Si and B micron-scale particles can be used in a like manner. In some embodiments, the micron-scale metal particles can be in the form of metal flakes, such as high aspect ratio copper flakes, for example. Thus, in some embodiments, the metal nanoparticle paste compositions described herein can contain a mixture of copper nanoparticles and high aspect ratio copper flakes or another type of micron-scale copper particles. Specifically, in some embodiments, the metal nanoparticle paste compositions can contain about 30% to about 90% copper nanoparticles by weight and about 0.01% to about 15% or 1% to 35% high aspect ratio copper flakes by weight.

Other micron-scale metal particles that can be used equivalently to high aspect ratio metal flakes include, for example, metal nanowires and other high aspect ratio particles, which can be up to about 300 microns in length. The ratio of metal nanoparticles to metal nanowires may range between about 10:1 to about 40:1, according to various embodiments. Suitable nanowires may have a length of about 5 microns to about 50 microns, and a diameter of about 100 nm to about 200 nm, for example.

In some embodiments, nanoscale conductive additives can also be present in the metal nanoparticle paste compositions. These additives can desirably provide further structural stabilization and reduce shrinkage during metal nanoparticle consolidation. Moreover, inclusion of nanoscale conductive additives can increase electrical and thermal conductivity values that can approach or even exceed that of the corresponding bulk metal following nanoparticle consolidation, which can be desirable for promoting heat transfer according to the disclosure herein. In some embodiments, the nanoscale conductive additives can have a size in at least one dimension ranging from about 1 micron to about 100 microns or ranging from about 1 micron to about 300 microns. Suitable nanoscale conductive additives can include, for example, carbon nanotubes, graphene, nanodiamond, and the like. When present, the metal nanoparticle paste compositions can contain about 1% to about 10% nanoscale conductive additives by weight, or about 1% to about 5% nanoscale conductive additives by weight.

Additional substances that can also optionally be present in the metal nanoparticle paste compositions include, for example, flame retardants, UV protective agents, antioxidants, carbon black, graphite, fiber materials (e.g., chopped carbon fiber materials), diamond, and the like.

Diamond particles suitable for use in the metal nanoparticle paste compositions may have a size ranging from about 1 micron to about 1000 microns or about 1 micron to about 750 microns, which can provide for good particle dispersion and acceptable paste dispensability. Diamond particles having a size ranging from about 200 microns to about 250 microns can represent a good compromise between providing effective dispersion and a minimized grain boundary for discouraging phonon scattering. Other suitable size ranges for the diamond particles can range from about 25 microns to about 150 microns, or about 50 microns to about 250 microns, or from about 100 microns to about 250 microns, or from about 100 microns to about 200 microns, or from about 150 microns to about 250 microns.

Nanoparticle paste compositions suitable for use in filling vias, trenches, recesses, or similar conduits according to the present disclosure can be formulated using any of the metal nanoparticle paste compositions described hereinabove. In addition, according to some embodiments, multiple metals may be present in the metal nanoparticle paste compositions.

In some or other embodiments, suitable metal nanoparticle paste compositions can include a mixture of metal nanoparticles, other nano-sized particles (i.e., particles having a dimension of about 100 nm or less), and/or micron-sized particles. The metal nanoparticle paste compositions may comprise copper nanoparticles, according to more specific embodiments.

Sprayable metal nanoparticle formulations may also be utilized to deposit any of the electronic components within the PCBs disclosed herein. For example, non-printed electronics components formed from metal nanoparticles may be produced by spraying a suitable spray formulation onto the ceramic substrates.

Accordingly, the present disclosure provides multi-layer printed circuit boards (PCBs) comprising a ceramic substrate, such as AlN or SiN ceramic substrates, having one or more conductive traces formed thereupon. The multi-layer PCBs may comprise at least one layer formed from such ceramic substrates, and preferably, two or more such ceramic substrates may be adhered together and in electrical communication with one another. More specifically, such multi-layer PCBs may comprise two or more ceramic substrates adhered together, each ceramic substrate having one or more conductive traces defined thereon and in which the one or more conductive traces are formed through consolidation of metal nanoparticles, and the one or more conductive traces in a first ceramic substrate layer are in electrical communication with at least one second ceramic substrate layer adjacent thereto.

One or more through-plane vias may extend through the ceramic substrate as well, wherein the one or more through-plane vias are filled with a conductive material. The conductive material may be formed by consolidating metal nanoparticles with one another according to particular embodiments of the present disclosure. For example, the conductive material may comprise a metal plug formed by consolidating metal nanoparticles within the one or more through-plane vias. The conductive material within at least a portion of the one or more through-plane vias may establish electrical communication between adjacent ceramic substrate layers of the multi-layer PCBs. In some embodiments, at least a portion of the through-plane vias may be thermal vias for promoting thermal conductivity, which are not necessarily in electrical communication with the one or more conductive traces in adjacent ceramic substrate layers.

The one or more conductive traces may be defined upon the surface plane (outer surface) of the ceramic substrate, located within a groove (channel or trench) defined upon the ceramic substrate, or any combination thereof. Multiple ceramic substrate layers may be bonded together (e.g., with an adhesive) and electrically interconnected to form the multi-layer PCBs of the present disclosure. Depending upon the location of the ceramic substrates in the multi-layer PCBs, the one or more conductive traces may be formed directly upon the ceramic substrate or a groove defined thereof, upon a bonding layer formed from metal nanoparticles differing from those defining the one or more conductive traces, or upon an adhesive layer disposed upon the ceramic substrate.

AlN and/or SiN may be particularly suitable ceramic substrates. AlN and SiN may be particularly suitable ceramic substrates due to their high thermal conductivity and low cost. In addition to AlN and SiN, other ceramic substrates that may be suitable for use in the disclosure herein include, for example, cubic BN (130 W/m·K), BeO (330 W/m·K), diamond (2300 W/m·K), BAs (1300 W/m·K), isotopically enriched cubic $^{10}$BN and cubic $^{11}$BN (>1600 W/m·K), and cubic $C_3N_4$. AlN and/or SiN may be mixed with any of the foregoing ceramic materials in ceramic substrates that may be suitable for use in the present disclosure. Moreover, all of the ceramic substrate layers in a given multi-layer PCB need not necessarily be formed from the same ceramic substrates. For example, ceramic substrates consisting essentially of AlN, SiN or any combination thereof may comprise a portion of the ceramic substrate layers in a multi-layer PCB, and at least some ceramic substrate layers having a different composition may be present in one or more select locations.

Aluminum nitride (AlN) has a hexagonal crystal structure and is a covalent material. The use of sintering aids and hot pressing may be used to produce a dense technical grade material for use as a ceramic substrate. AlN is stable to very high temperatures in inert atmospheres. In air, surface oxidation begins above 700° C. A surface layer of aluminum oxide (5-10 nm in thickness) forms, which protects the material up to 1370° C. Above this temperature, bulk oxidation may occur. Aluminum nitride is stable in hydrogen and carbon dioxide atmospheres up to 980° C. The material dissolves slowly in mineral acids through grain boundary attack, and in strong alkalis through attack on the aluminum nitride grains. The material hydrolyzes slowly in water. As such, AlN may be a particularly suitable ceramic substrate for use in the disclosure herein, given its high thermal conductivity and thermal stability below the melting point of bulk copper.

A disappearing sintering aid, such as $Li_2O$, may be used with AlN to promote densification during the initial and middle stages of sintering and then be removed in gaseous form during the final stage of sintering when producing an AlN ceramic substrate for subsequent conductive trace formation thereon. From thermodynamic considerations, such as assessment of Gibbs free energy change of formation of $Al_2O_3$ compounds including metal-oxide and evaluation of the vapor pressure of metal-oxide, $Li_2O$ may function as a disappearing sintering aid for AlN sintering. Doping with $Li_2O$ may result in densification of AlN ceramics containing $Y_2O_3$ or CaO additives by sintering at a firing temperature of about 1600° C. Higher density ceramics may afford better mechanical strength and improved thermal performance. Alternately, $LiYO_2$ may be used as a sintering aid with AlN instead of $Li_2O$ and $Y_2O_3$.

SHAPAL is a composite material comprising AlN and BN and has a thermal conductivity of approximately 90 W/m·K. It has excellent thermal shock properties and can be easily machined into complex geometries. This ceramic may also function as a suitable ceramic substrate for forming conductive traces thereon in the present disclosure.

Any suitable technique may be utilized to form ceramic substrates prior to deposition of one or more conductive traces thereon. Powder compaction or tape casting procedures may be used to form ceramic substrates suitable for use in the disclosure herein. Tape casting and use of sintering aids, particularly disappearing sintering aids, may facilitate formation of ceramic substrates having a thickness as low as about 200 microns and in sizes compatible with PCB manufacturing (e.g., 5"×7" sheets). Particularly suitable ceramic substrates may be substantially planar, such that they may be readily stacked in forming a multi-layer PCB. One or more conductive traces may be formed on the surface plane of such ceramic substrates, or the one or more conductive traces may be below the surface plane in a groove or trench.

Any suitable technique may be used to bond multiple ceramic substrate layers together in the present disclosure. Further details are provided hereinbelow. Suitable techniques for bonding multiple substrate layers together include, for example, curing of high-temperature epoxy adhesives (~260° C. upper limit of use), polyimide adhesives (~350° C. upper limit of use), silicone adhesives, ceramic adhesives mixed with conductive additives (~600° C. upper limit of use; e.g., cubic BN, or AlN), or the like. Multiple substrate layers may also be directly bonded together in some instances without using a traditional adhesive. For example, mechanical attachment or a metal nanoparticle adhesive may be utilized to promote adherence between adjacent substrate layers. When an adhesive is used, bond layers between each ceramic substrate layer may range from about 10 microns to about 100 microns in thickness to facilitate good through-plane thermal conductivity by limiting phonon scattering. Certain polymer adhesives may be applied at layer thicknesses down to about 25 nm to improve thermal conductivity between adjacent substrate layers still further, such as bonding layer thicknesses between about 25 nm to about 5 microns. Use of polymer adhesives may facilitate flexibility of the PCBs, thereby affording thermal tolerance and limiting thermomechanical stress during fabrication and device heating. Even above the glass transition temperature of the adhesive, good interlayer bonding may still be realized through van der Waals forces.

Suitable adhesives may be precoated onto the ceramic substrates and stored precured until conductive traces and other features are formed thereon and ceramic layer stacking takes place. Alternately, ceramic substrates may remain uncoated and a suitable adhesive may be applied on-demand when forming a multi-layered PCB. Still further, conductive traces may be formed upon uncoated ceramic substrates, and an appropriate bonding layer may be applied later to promote formation of a multi-layer PCB. Optionally, an adhesive layer may be deposited upon an uncoated ceramic substrate in a selected location prior to forming conductive traces thereon.

Encapsulation in the form of conformal coatings or masking materials, for example, may be applied upon an outer surface of a multi-layer PCB after fabrication thereof to provide further protection of exposed metal against oxidation. For example, conformal coatings or masking materials may overcoat one or more conductive traces formed from copper nanoparticles to inhibit formation of copper oxide. Encapsulation in this location may also aid in preventing loosely bound or unbound conductive traces from falling off or shifting upon the ceramic substrate. Interior ceramic substrate layers of a multi-layer PCB, in contrast, may be less susceptible to oxidation, since the conductive traces are effectively protected by adjacent ceramic substrate layers of the PCB.

Metal nanoparticles, such as copper nanoparticles, may be deposited upon the ceramic substrates in any suitable manner, such as screen printing, stencil printing, pneumatic dispensing, aerosol printing, or inkjet printing to define conductive traces after heating to consolidate the metal nanoparticles together. Via filling with metal nanoparticles may be accomplished in a similar manner, as well as through doctor blading, for example. Conductive traces of about 10 microns in thickness may exhibit electrical conductivity values up to about 70% that of bulk copper (Integrated Annealed Copper Standard-IACS). When grooves are present within a ceramic substrate (to form the conductive traces below the surface plane of the ceramic substrate), a suitable metal nanoparticle composition can be doctor-bladed directly into the grooves or direct printed therein, thereby affording rapid metal deposition for forming a conductive trace. Since metal traces and filled vias are protected by adjacent substrate layers in a multi-layer PCB, one may choose to not bond the conductive traces at all and give them the ability to relax during thermal excursions, whereby the metal can freely expand and contract while confined and protected from oxidation.

Vias are easily integrated into the ceramic substrates and may be drilled out or machined after initial assembly. Similarly, grooves may be introduced into the substrate by machining. After forming grooves and/or vias, these structures may be filled with metal nanoparticles and undergo fusion in accordance with the disclosure above. Filling of vias or grooves with metal nanoparticles may take place separately or at the same time as when depositing metal nanoparticles upon the surface plane of the ceramic substrate. Vias as narrow as about 1 mm and as wide as about 15 mm and about 0.5 mm to about 5 mm in thickness may exhibit thermal conductivity values up to about 289 W/m·K when filled with a metal plug formed from consolidated copper nanoparticles. Further disclosure regarding vias and incorporation of metal nanoparticles therein follows below.

The grooves in which conductive traces may be defined may have a range of widths, and may be in any shape compatible with a particular application. In non-limiting examples, grooves for containing conductive traces may range from about 10 microns to about 5 mm in width, and/or the spacing (pitch) between adjacent conductive traces within grooves may range from about 10 microns to about 10 mm or even larger depending on application-specific needs, including the potential for cross-talk between adjacent conductive traces. Grooves for forming conductive traces may have any cross-sectional profile, such as triangular, rectangular, circular, or the like.

Conductive traces may also be formed directly upon the surface plane of the ceramic substrates instead of in a groove. The width and pitch of such conductive traces may reside in similar ranges to those specified above for groove-contained conductive traces. In both types of conductive traces, the conductive traces may be up to about 10 microns in thickness.

Proper alignment may be needed to place the multiple substrate layers in electrical communication with one another in a multi-layer PCB. Alignment pins may be used to facilitate stacking of multiple ceramic layers upon one another when forming a multi-layer PCB. Printed or engraved alignment marks and/or fiducials may also be utilized to facilitate proper placement of the multiple substrate layers in a multi-layer PCB.

In addition, a non-printed electronic component may be located within a groove or cavity upon a surface of the ceramic substrate, or a non-printed electronic component may be disposed upon the surface plane of the ceramic substrate. Desirably, incorporation of a non-printed electronic component with a groove or cavity may decrease the PCB thickness upon stacking multiple ceramic substrate layers together to form a multi-layer PCB. A non-printed electronic component located upon the surface plane of a first ceramic substrate may be accommodated within a groove or cavity of an adjacent ceramic substrate layer, in some configurations. In any event, the non-printed electronic component may be in electrical communication with one or more conductive traces upon at least one ceramic substrate layer, particularly one or more conductive traces in an adjacent ceramic substrate layer. Suitable non-printed electronic components may include, but are not limited to, termination resistors and bypass capacitors.

In some multi-layer printed circuit board configurations, a non-printed electronic component may be disposed upon the surface plane of a ceramic substrate and bridge a gap between a first portion and a second portion of at least one conductive trace. Bonding of the non-printed electronic component to each portion of the conductive trace(s) may promote electrical conductivity therewith, such as through conductive adhesives or wire bonding methods. In at least some examples, bonding of the non-printed electronic component to each portion of the conductive trace(s) may be accomplished by wire bonding methods utilizing metal nanoparticles, such as copper nanoparticles, as a bonding material. Further details regarding suitable wire bonding methods utilizing metal nanoparticles may be found in U.S. Pat. No. 10,283,482, which is incorporated herein by reference in its entirety.

Through-plane vias may be utilized to establish electrical communication between adjacent ceramic substrate layers in a multi-layer PCB. Through-plane vias in a ceramic substrate can have a range of sizes, or they can all be of substantially the same size. The size range of the through-plane vias that may be filled with metal nanoparticles according to the present disclosure is not considered to be particularly limited and may range from micron-sized up to sizes larger than one millimeter or more. According to more specific embodiments, through-plane vias for electrically interconnecting adjacent PCB layers may be about 1 mm or less in diameter, or about 100 microns or less in diameter. Thermal vias, if present, may range from about 100 microns up to about 5 mm in diameter, or about 5 mm to about 10 mm in diameter, or about 10 mm to about 30 mm in diameter. Either type of through-plane via may be satisfactorily filled with metal nanoparticles, such as copper nanoparticles, in the disclosure herein. Through-plane vias over about 5 mm in width may incorporate a metal scaffolding or similar support structure to maintain flatness across the top and bottom surfaces of the via and to prevent metal nanoparticles from falling out of the via before consolidation takes place.

Suitable through-plane vias may have any cross-sectional profile as they extend through a given ceramic substrate layer. According to some embodiments, the through-plane vias may have a round cross-sectional profile; thus, such vias have a cylindrical shape. Other suitable via cross-sectional profiles include, but are not limited to, square, rectangular, triangular, ovular, or other regular or irregular geometric shapes. The cross-sectional profile of the through-plane vias may be substantially equal in size upon both faces of the ceramic substrate, or the cross-sectional profiles may differ in size on opposite substrate faces, according to some embodiments. That is, the vias may be tapered in some configurations. Tapering may increase mechanical adhesion of copper or another metal to the via walls to limit drop out of a metal plug due to vibration and shock. Surface roughness (e.g., resulting from the process of drilling or machining the via holes) may also increase mechanical adhesion.

In still further embodiments, the PCBs described herein may also include vias that extend laterally within the PCB (i.e., extending parallel to the first and second faces of the ceramic substrate in one or more PCB layers), as opposed to the through-plane vias described above. The vias extending laterally may likewise be filled with a suitable metal nanoparticle composition, which may then be consolidated to a metal plug for promoting lateral heat transfer. Such lateral vias may be blind vias in many instances.

Filling of through-plane vias and/or grooves with metal nanoparticles may take place by any suitable technique. Suitable techniques may include those in which the through-plane vias or grooves are filled concurrently with metal nanoparticles, or those in which grooves and through-plane vias are filled separately. In illustrative embodiments, syringes, syringe arrays, or other arrangements of dispensation devices containing a suitable metal nanoparticle composition may be used for filling the vias or grooves, or for printing conductive traces directly upon a surface of a ceramic substrate. In other illustrative embodiments, printing techniques such as screen printing, stencil printing, inkjet printing, doctor blading, or the like may be used to fill the through-plane vias or grooves with metal nanoparticles. Doctor blading techniques may be particularly desirable for concurrently filling grooves and through-plane vias with a metal nanoparticle composition in preparation for subsequent consolidation thereof.

In various embodiments, consolidating the metal nanoparticles may comprise heating the metal nanoparticles above the fusion temperature, applying pressure to the metal nanoparticles, or any combination thereof. Any heat source may be used to heat the metal nanoparticles above the fusion temperature, such as an oven, autoclave, heating tape, radiant heat source, laser, or the like. In some embodiments, direct laser sintering of the metal nanoparticles within through-plane vias or grooves may take place. Other techniques for consolidating the metal nanoparticles within the through-plane vias or grooves may include, for example, applying pressure to the metal nanoparticles. The consolidated metal nanoparticles may have a nano-sized grain structure ranging from about 100 nm to about 500 nm in size and a porosity ranging from about 2% to about 12% by volume, in a particular example. Further sintering following metal nanoparticle consolidation may achieve a porosity ranging from 0% (fully dense) to about 2% by volume, which may approach the conductivity of bulk metal (copper).

The various layers of a multi-layer PCB may be processed individually to produce and fill through-plane vias and/or grooves with metal nanoparticles and/or introduce embedded and/or surface-mounted electronic components onto the ceramic substrate. The individual substrate layers may then be assembled in one or more separate operations of bonding the individual layers together. Assembly may take place by a laying up process in a non-limiting example. Since copper nanoparticles revert to bulk copper upon consolidation and can be reheated essentially unlimited times without harm, the individual substrate layers may be pre-formed and then undergo bonding together. A conformal layer may be utilized to protect the conductive traces from oxidation, if needed. Accordingly, the individual substrate layers can be inspected for proper alignment, trace spacing and dimensions, for example, during the course of forming a multi-layer PCB, thereby avoiding costly yield reduction and allowing replacement of a faulty section or layer during multi-layer PCB assembly.

Figure 3:
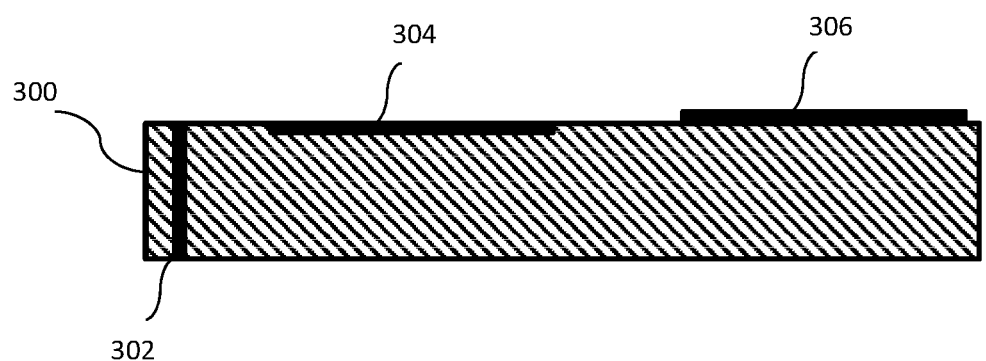
FIG. 3 is a diagram showing a cross-sectional view of one layer of an illustrative multi-layer PCB having conductive traces and through-plane vias formed thereon.
Figure 4:
FIG. 4 is a diagram showing a cross-sectional view of an illustrative multi-layer PCB.

FIG. 3 is a diagram showing a cross-sectional view of one layer of an illustrative multi-layer PCB having conductive traces and through-plane vias formed thereon. As shown, substrate 300 includes vias 302 extending through-plane. Lateral vias (not shown) may also be present within substrate 300. Conductive traces of various types may be present upon substrate 300. Groove-based conductive traces 304 may be present below the surface plane of substrate 300, and surface-based conductive traces 306 may be located upon the surface plane of substrate 300. FIG. 4 is a diagram showing a cross-sectional view of illustrative multi-layer PCB 400, which includes several PCB layers 401 (formed from substrates 300) adhered to one another in a stacking arrangement with electrical communication between at least adjacent layers. Additional electronic components (not shown in FIG. 3 or 4) that are non-printed may be disposed in a groove or cavity or located upon the surface plane. In either case, the non-printed electronic component(s) may be in electrical communication with a conductive trace or via.

Figure 5A:
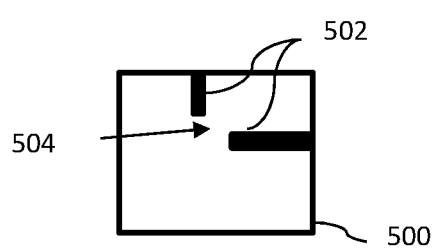
FIGS. 5A and 5B are diagrams showing a top view of an illustrative PCB substrate having a conductive trace with a gap formed therein.
Figure 5B:
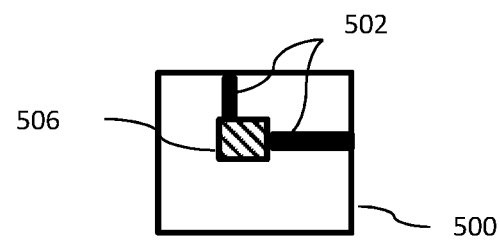

FIGS. 5A and 5B are diagrams showing a top view of illustrative PCB substrate 500 having conductive trace 502 with gap 504 formed therein. In FIG. 5B, non-printed electronic component 506 bridges gap 504, thereby establishing electrical communication with each portion of conductive trace 502.

Figure 6:
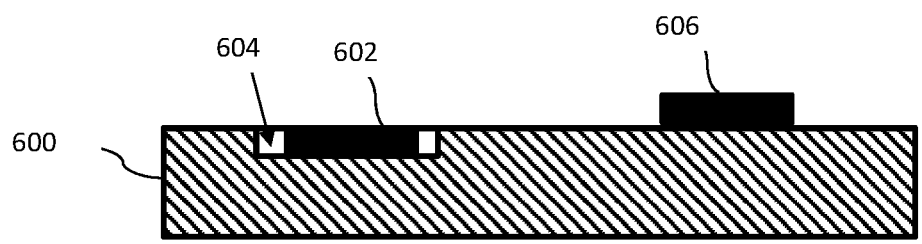
FIG. 6 is a diagram showing a cross-sectional view of one layer of an illustrative multi-layer PCB having a non-printed electronic component located below the substrate plane in a recess and a non-printed electronic component upon the substrate plane.

FIG. 6 is a diagram showing a cross-sectional view of one layer of an illustrative multi-layer PCB having a non-printed electronic component located below the substrate plane in a recess and a non-printed electronic component located upon the substrate plane. As shown, illustrative PCB substrate 600 includes non-printed electronic component 602 located below the substrate plane in recess 604 and non-printed electronic component 606 located upon the substrate plane. A conductive trace (not shown) may electrically interconnect non-printed electronic components 604 and 606 or to a via for establishing electrical communication to an adjacent substrate layer. It is to be appreciated that non-printed electronic components 604 and 606 are not necessarily electrically connected in all instances, and may be connected to other printed or non-printed electronic components in the same substrate layer or in an adjacent substrate layer.

Figure 7:
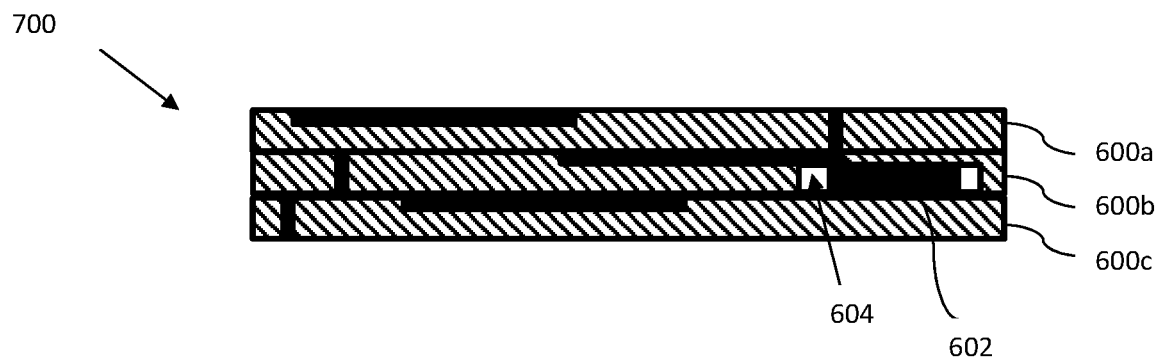
FIG. 7 is a diagram showing a cross-sectional view of an illustrative multi-layer PCB having a non-printed electronic component upon a first substrate layer housed in a recess of a second substrate layer adjacent thereto.

Moreover, a non-printed electronic component located upon the substrate plane may be housed in a recess in an adjacent substrate layer in a multi-layer PCB. As shown in FIG. 7, illustrative multi-layer PCB 700 includes substrate layers 600a, 600b and 600c. Non-printed electronic component 602 is located upon the substrate plane of substrate layer 600c and is housed in recess 604 upon the backside of substrate layer 600b. Non-printed electronic component 602 may be disposed horizontally or vertically and may feature electrical connections to any of substrate layers 600a-600c.

Additional details concerning formation of ceramic substrates for forming individual substrate layers and bonding of individual substrate layers to one another to form a multi-layer PCB follows hereinafter. Alignment marks may be printed or engraved upon both sides of the ceramic substrate, and/or fiducials may be placed upon both sides. Alignment pins may also be utilized. An epoxy layer may then be placed upon one side of the ceramic substrate and undergo precuring to a first cure state. Grooves, vias, and the like may be formed before or after application of the epoxy layer for introduction of buried components, conductive traces, and/or vias, if present. Through-plane vias and grooves may be drilled out, carved, or etched using any standard ceramic processing equipment.

Grooves for defining patterns for the conductive traces may also be defined at this stage to provide a desired width, depth and pitch between adjacent conductive traces. After filling the grooves and vias with metal nanoparticles, the conductive traces and vias may contain bulk metal (a metal plug in the case of through-plane vias) that is flush with the surface plane of the ceramic substrate.

Optionally, a thin (100 nm to 10 microns) metal layer may be placed upon the walls of the through-plane vias by electroplating prior to filling the through-plane vias with metal nanoparticles. The metal layer may promote adhesion of the consolidated nanoparticles to the via walls. After metal nanoparticle consolidation takes place, the exposed end(s) of the vias may be polished/machined, if necessary for smoothness. Conductive traces may be processed similarly. After via filling takes place, conductive traces may be printed over the vias using metal nanoparticles, thereby establishing electrical communication therebetween. The vias may undergo consolidation before printing the metal nanoparticles, or metal nanoparticles may be printed upon unconsolidated vias, with consolidation of the metal nanoparticles in each location occurring concurrently in such cases.

Passive components and/or non-printed electronic components may then be printed or placed in a desired location, such as bridging a gap of a conductive trace or within a recess upon the ceramic substrate. Illustrative passive components that may be present as a non-printed electronic component upon a ceramic substrate may include, for example, resistors, capacitors, diodes, LEDs, transformers, switches, transducers, detectors, sensors, piezoelectric devices, magnetic devices, MEM devices, batteries, Peltier coolers, and the like. These and other passive components may be printed in some cases.

For producing a multi-layer PCB, a thin layer epoxy may be placed upon the back side of the ceramic substrate, opposite the conductive traces and electronic components. A variable number of the ceramic substrates may then be stacked, aligned, clamped together and pressed at about 7-50 psi to bond the various layers together. Optionally, some metal nanoparticle consolidation may take place during the application of pressure, if consolidation of metal nanoparticles was is not already complete. Curing and fusion cycles may range up to about 30 minutes, particularly from about 1 to about 8 minutes. As a comparative example, a 170° C. Tg FR4 material may be bonded at 375° F. (190° C.) for 150 minutes at about 300 PSI to form a multi-layer PCB.

To apply the epoxy layer as an adhesive upon the ceramic substrate, particularly for forming one or more conductive traces thereon, the epoxy layer may be spin coated, spray-painted or painted onto the surface of the ceramic substrate to achieve a thin uniform coating across the entire surface. The thickness may depend on the surface roughness. Due to its hardness, the epoxy layer may be easily sanded and polished and smoothed out in that fashion to exhibit very low surface roughness (e.g., less than about 1 micron). The adhesive thickness may be tailored to be no more than 3-5 times the surface roughness when in the 1-3 micron range or 3 to 15 micron range; above this range the adhesive thickness may about 2.2 times the surface roughness for 5-10 micron surface roughness values, or about 11 to 22 microns in thickness. At less than 1 micron roughness, the thickness may be about 1-5 microns and may be as thin as 25 nm. Alternately, an epoxy may be spot-coated (i.e., as a discontinuous layer) upon the ceramic substrate. When the adhesive is applied for purposes of promoting formation one or more conductive traces upon the ceramic substrate, the layer thickness of the adhesive may range from about 25 nm to about 3 microns in thickness, as a non-limiting example.

Adhesives for promoting bonding of multiple PCB layers together may be applied through similar techniques to those listed above. Adhesive layers for promoting adherence of PCB layers together to form a multi-layer PCB may be located upon the same face of the ceramic substrate as where conductive traces are located and/or upon the face of the ceramic substrate opposite the conductive traces (i.e., the back side of the ceramic substrate). When the adhesive is applied for purposes of promoting bonding of multiple PCB layers together, the layer thickness of the adhesive may range from about 5 microns to about 25 microns.

Precuring of an adhesive may take place at about 160° C. for about 2 minutes, or for about 5 minutes at about 150° C. for 5 min, or for about 10 minutes at about 140° C. to result in a non-tacky surface. Conductive traces can be direct printed onto an adhesive layer after precuring and fused under nitrogen (e.g., less than 100 ppm oxygen, or less than 65 ppm oxygen or less than 30 ppm oxygen) for about 4-10 minutes at about 180-235° C. The bond strength of the conductive traces may meet or exceed the ASTM standard tape test (ASTM D3359) using a cross-cut pattern for achieving 5B performance (e.g., no removal of bonded metal). Bonding of the conductive traces to the ceramic substrate may occur under these conditions. Adhesive precuring may also be performed to retain metal nanoparticles in place if consolidation of the metal nanoparticles takes place simultaneously or substantially simultaneously through adhering multiple board layers together, such as during a laying up process.

A three-layer PCB, for example, can be as thin as about 600 microns and as thick as about 4.5-5 mm depending on the individual ceramic substrate thicknesses employed. Different substrate thicknesses for each layer may be employed, again depending upon particular application-specific needs. For example, a thicker (e.g., 1.5 mm thick ceramic substrate) may be used for the top and bottom layers of a PCB and interior layers may be thinner (e.g, 200 micron thick ceramic substrate). Interior layers may also be tiled together from smaller ceramic substrate sections that are abutted to make the full-size footprint of the PCB layer. The foregoing approach may be particularly effective for thinner ceramic substrates, which usually are provided in smaller dimensions than are thicker ceramic substrates.

Individual ceramic substrate layers may be stored for several months at any stage after curing/precuring and finished later for final assembly of a multi-layered PCB. Likewise, conductive trace formation and via filling with metal nanoparticles may take place before storing for final assembly at a later time. The metal nanoparticles may be consolidated with one another prior to storage, or the metal nanoparticles may undergo consolidation when adhering multiple board layers together. Particularly when metal nanoparticle consolidation takes place prior to storage, a thin, conformal layer may be applied to protect the conductive traces and filled vias from oxidation.

Accordingly, PCB formation methods of the present disclosure may comprise: providing a ceramic substrate, forming one or more conductive traces upon the ceramic substrate by consolidating metal nanoparticles thereon, and forming a multi-layer PCB by adhering two or more ceramic substrates together. The one or more conductive traces in a first ceramic substrate layer may be in electrical communication with at least one second substrate layer adjacent thereto. One or more through-plane vias may also be present within the ceramic substrates and filled with metal nanoparticles in the disclosure herein. Following consolidation of the metal nanoparticles within the through-plane via, a conductive material, particularly a metal plug, may be formed therein. The conductive material within the through-plane vias may facilitate electrical communication between adjacent ceramic substrate layers.

Vias may be filled via direct syringe dispensing, stencil printing, screen printing, aerosol printing, doctor blading, spatulas or similar equipment. Vacuum assistance may be utilized to force the metal nanoparticles quickly and fully into the vias, if desired. A backing may be employed to achieve high packing density, or a dead weight may be placed on the through-plane vias after filling with metal nanoparticles. Application pressures for filling through-plane vias may be in the 5-50 psi range for dispensation of metal nanoparticles using ordinary dispensing equipment.

Conductive traces may be printed via direct syringe dispensing, stencil printing, screen printing, aerosol printing, doctor blading (into grooves), or similar equipment. Application pressures forming conductive traces may be in the 5-50 psi range for dispensation of metal nanoparticles using ordinary dispensing equipment.

Passive components may be printed via direct syringe dispensing, stencil printing, screen printing, aerosol printing, doctor blading, or similar equipment. Application pressures for forming passive components and other printed electronic components may be in the 5-50 psi range for dispensation of metal nanoparticles using ordinary dispensing equipment.

Non-printed electronic components maybe placed upon a ceramic substrate or within a groove thereon using conventional electronics manufacturing techniques familiar to persons having ordinary skill in the art.

Once a plurality of ceramic substrates have been formed in a desired manner with desired functionality thereon, the individual ceramic substrates may be stacked with the aid of fiducials, alignment pins, or the like to prepare the individual ceramic layers of a multi-layer PCB for bonding together.

Finally, one may protect the conductive traces upon the outermost surface of a PCB from oxidation by applying a conformal coating or solder mask upon the substrate surface, except for solder pad connection points and other components that may not be effectively encapsulated. Buried ceramic layers, in contrast, may leave their conductive traces uncoated. Other electronic devices may be connected to the final multi-layer PCB after stacking, bonding, and surface protection have been completed.

Embodiments disclosed herein include:

A. Methods for forming a printed circuit board (PCB). The methods comprise: providing a ceramic substrate; and forming one or more conductive traces upon the ceramic substrate by consolidating metal nanoparticles upon the ceramic substrate.

B. Printed circuit boards (PCBs). The PCBs comprise: a ceramic substrate having one or more conductive traces defined thereon, the one or more conductive traces being formed through consolidation of metal nanoparticles.

Each of embodiments A and B may have one or more of the following additional elements in any combination:

Element 1: wherein the conductive traces are defined upon the surface of the ceramic substrate, in a groove defined upon the ceramic substrate, or any combination thereof.

Element 2: wherein one or more through-plane vias extend through the ceramic substrate, and metal nanoparticles are consolidated within the vias.

Element 3: wherein the metal nanoparticles comprise copper nanoparticles.

Element 4: wherein the method further comprises adhering multiple ceramic substrates having one or more conductive traces defined thereon stacked together to form a multi-layer printed circuit board.

Element 5: wherein the ceramic substrate comprises AlN, SiN, or any combination thereof.

Element 6: wherein a non-printed electronic component is disposed upon the ceramic substrate or within a groove or cavity upon the ceramic substrate, the non-printed electronic component being in electrical communication with one or more conductive traces.

Element 7: wherein multiple ceramic substrates having one or more conductive traces defined thereon are stacked together and adhered to form a multi-level printed circuit board.

By way of non-limiting example, exemplary combinations applicable to A include, but are not limited to: 1 and 2; 1 and 3; 1-3; 1-4; 1 and 5; 1, 3 and 5; 1 and 6; 2 and 3; 2 and 4; 2 and 5; 2 and 6; 3 and 5; 3 and 6; 4 and 5; 4 and 6; and 5 and 6. Exemplary combinations applicable to B include, but are not limited to: 1 and 2; 1 and 3; 1-3; 1 and 5; 1, 3 and 5; 1 and 6; 2 and 3; 2 and 5; 2 and 6; 3 and 5; 3 and 6; 5 and 6; 1 and 7; 2 and 7; 3 and 7; 5 and 7; and 6 and 7.

Additional embodiments disclosed herein include:

A. Methods for forming a multi-layer printed circuit board (PCB). The methods comprise: providing a ceramic substrate; forming one or more conductive traces upon the ceramic substrate by consolidating metal nanoparticles thereupon; and forming a multi-layer printed circuit board by adhering two or more ceramic substrates together; wherein the one or more conductive traces in a first ceramic substrate layer are in electrical communication with at least one second ceramic substrate layer adjacent thereto.

B. Multi-layer printed circuit boards (PCBs). The multi-layer PCBs comprise: two or more ceramic substrates adhered together, each ceramic substrate having one or more conductive traces defined thereon; wherein the one or more conductive traces are formed through consolidation of metal nanoparticles; and wherein the one or more conductive traces in a first ceramic substrate layer are in electrical communication with at least one second ceramic substrate layer adjacent thereto.

Each of embodiments A and B may have one or more of the following additional elements in any combination:

Element 1: wherein the one or more conductive traces are defined upon a surface plane of the ceramic substrate, in a groove defined upon the ceramic substrate, or any combination thereof.

Element 2: wherein one or more through-plane vias extend through the ceramic substrate, the one or more through-plane vias being filled with a conductive material.

Element 3: wherein the method further comprises filling the one or more through-plane vias with metal nanoparticles; and consolidating the metal nanoparticles within the one or more through-plane vias to form the conductive material therein as a metal plug.

Element 3A: wherein the conductive material comprises a metal plug formed by consolidating metal nanoparticles within the one or more through-plane vias.

Element 4: wherein at least a portion of the through-plane vias establish the electrical communication between adjacent layers in the multi-layer printed circuit board.

Element 4A: wherein at least a portion of the through-plane vias establish electrical communication between adjacent ceramic substrate layers.

Element 5: wherein at least a portion of the through-plane vias comprise thermal vias.

Element 6: wherein the metal nanoparticles are consolidated to form the one or more conductive traces and the metal plug within the one or more through-plane vias at substantially the same time.

Element 7: wherein the metal nanoparticles comprise copper nanoparticles.

Element 8: wherein the ceramic substrate comprises AlN, SiN, or any combination thereof.

Element 9: wherein a non-printed electronic component is disposed upon a surface plane of the ceramic substrate or within a groove or cavity upon the ceramic substrate, the non-printed electronic component being in electrical communication with the one or more conductive traces upon at least one ceramic substrate layer.

Element 10: wherein the non-printed electronic component is disposed upon the surface plane of the ceramic substrate and bridges a gap extending between a first portion and a second portion of at least one conductive trace thereupon.

Element 11: wherein the non-printed electronic component is disposed upon the surface plane of the ceramic substrate forming the first ceramic substrate layer and is housed within a groove or cavity defined upon the ceramic substrate forming an adjacent ceramic substrate layer.

Element 12: wherein the one or more conductive traces are formed upon an adhesive layer or a bonding layer in contact with the ceramic substrate.

By way of non-limiting example, exemplary combinations applicable to A and B include, but are not limited to: 1 and 2; 1, 2, and 3 or 3A; 1, 2, and 4 or 4A; 1, 2 and 5; 1, 2 and 6; 1 and 7; 1 and 8; 1, 7 and 8; 1 and 9; 1, 7 and 9; 1 and 7-9; 1, 9 and 10; 1, 9 and 11; 1 and 12; 2, and 3 or 3A; 2, and 4 or 4A; 2 and 5; 2 and 6; 2 and 7; 2 and 8; 2, 7 and 8; 2 and 7-9; 2 and 9; 2 and 8; 2, 9 and 10; 2, 9 and 11; 2 and 12; 7 and 8; 7 and 9; 7-9; 7, 9 and 10; 7, 9 and 11; 7 and 12; 8 and 9; 8-10; 8, 9 and 11; 8 and 12; 9 and 10; 9 and 11; 9 and 12; 10 and 11; 10 and 12; and 11 and 12.

To facilitate a better understanding of the disclosure herein, the following examples of various representative embodiments are given. In no way should the following examples be read to limit, or to define, the scope of the invention.

EXAMPLES

Example 1: Alignment fiducials are printed (four each in each corner on both sides) on three 4"×4" AlN plates having a thickness of 384 microns. Grooves in a standard serpentine resistance pattern (1 mm width, 20 micron deep, and 60 cm overall length in pad-to-pad distance in 10 legs/loops) are printed in designated locations on two plates (bottom and center PCB layers once stacked). Then, all three plates are spin-coated on the groove side with a 100 nm thick layer of a commercial two-component epoxy adhesive and are pre-cured at 160° C. for 2 min. Next, 2 mm diameter through-plane via holes are drilled in the desired areas of two plates (top and center PCB layers once stacked). A standard serpentine resistance pattern (1 mm line width, 50 micron thick, and 60 cm overall length in pad-to-pad distance in 10 legs/loops) is then screen-printed using a copper nanoparticle composition with a density of 2.7 g/mL such that the end pads are located at the through-plane via hole positions. All sheets are then consolidated separately in a four-stage Sikama (Falcon 5c) oven for a total of 7 minutes with a peak reflow temperature of 235° C. Epoxy adhesive is then applied to the backside of the center and top plates for bonding, which are then assembled such that the through-plane via holes align. Alignment is further aided with the fiducials. The through-plane via holes are then filled with a dense copper nanoparticle composition (4.3 g/mL), and the stacked assembly is placed in a hot press and cured at 400° F. for 50 min at 70 psi. Polishing of the copper plug in the filled through-plane vias may be performed, if needed, before a conformal coating is applied to the exposed copper trace on the top sheet. The pads stay exposed for an additional bonding operation like soldering components, connectors and the like.

Example 2: Alignment fiducials are printed (four each in each corner on both sides) on three 4"×4" AlN plates having a thickness of 384 microns. Grooves in a standard serpentine resistance pattern (1 mm width, 20 micron deep, and 60 cm overall length in pad-to-pad distance in 10 legs/loops) are printed in designated locations on two plates (bottom and center PCB layers once stacked). In the bottom plate, at a location where buried components are to be placed, an appropriate-size gap is not machined out. At the same location, cavities to house the buried components are machined out. Then, all three plates are spin-coated on the groove side with a 100 nm thick layer of a commercial two-component epoxy adhesive and are pre-cured at 160° C. for 2 min. Next, 2 mm diameter through-plane via holes are drilled in the desired areas of two plates (top and center PCB layers once stacked). A standard serpentine resistance pattern (1 mm line width, 50 micron thick, and 60 cm overall length in pad-to-pad distance in 10 legs/loops) is then screen-printed using a copper nanoparticle composition with a density of 2.7 g/mL such that the end pads are located at the through-plane via hole positions. All sheets are then consolidated separately in a four-stage Sikama (Falcon 5c) oven for a total of 7 minutes with a peak reflow temperature of 235° C. Components are then placed in a desired location using direct dispense of a copper nanoparticle composition for bonding, (e.g., Datacon 2200 evo—BESI). A second consolidation cycle substantially identical to the first consolidation cycle is then conducted. Epoxy adhesive is then applied to the backside of the center and top plates for bonding, which are then assembled such that the through-plane via holes and component cavities align. Alignment is further aided with the fiducials. The through-plane via holes are then filled with a dense copper nanoparticle composition (4.3 g/mL), and the stacked assembly is placed in a hot press and cured at 400° F. for 50 min at 70 psi. Polishing of the copper plug in the filled through-plane vias may be performed, if needed, before a conformal coating is applied to the exposed copper trace on the top sheet. The pads stay exposed for an additional bonding operation like soldering components, connectors and the like.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the features of the present disclosure are presented herein. Not all features of a physical implementation are described or shown in this application for the sake of clarity. It is understood that in the development of a physical embodiment incorporating the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The disclosure herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A method comprising:
   providing a ceramic substrate;
   forming one or more conductive traces upon the ceramic substrate by consolidating metal nanoparticles thereupon; and
   forming a multi-layer printed circuit board by adhering two or more ceramic substrates together; and
   wherein the one or more conductive traces in a first ceramic substrate layer are in electrical communication with at least one second ceramic substrate layer adjacent thereto;
   wherein one or more through-plane vias extend through the ceramic substrate, the method further comprising the steps of:
      filing the one or more through-plane vias with a conductive material, wherein the conductive material comprises metal nanoparticles; and
      consolidating the metal nanoparticles with the one or more through-plane vias to form the conductive material therein as a metal plug; and
   wherein the metal nanoparticles are consolidated to form the one more conductive traces and the metal plug within the one or more through-plane vias at substantially the same time.

2. The method of claim 1, wherein the one or more conductive traces are defined upon a surface plane of the ceramic substrate, in a groove defined upon the ceramic substrate, or any combination thereof.

3. The method of claim 1, wherein at least a portion of the through-plane vias establish the electrical communication between adjacent layers in the multi-layer printed circuit board.

4. The method of claim 1, wherein the metal nanoparticles comprise copper nanoparticles.

5. The method of claim 1, wherein a non-printed electronic component is disposed upon a surface plane of the ceramic substrate or within a groove or cavity upon the ceramic substrate, the non-printed electronic component being in electrical communication with the one or more conductive traces upon at least one ceramic substrate layer.

6. The method of claim 5, wherein the non-printed electronic component is disposed upon the surface plane of the ceramic substrate and bridges a gap extending between a first portion and a second portion of at least one conductive trace thereupon.

7. The method of claim 5, wherein the non-printed electronic component is disposed upon the surface plane of the ceramic substrate forming the first ceramic substrate layer and is housed within a groove or cavity defined upon the ceramic substrate forming an adjacent ceramic substrate layer.

8. The method of claim 1, wherein the one or more conductive traces are formed upon an adhesive layer or a bonding layer in contact with the ceramic substrate.

9. A multi-layer printed circuit board (PCB) comprising:
   two or more ceramic substrates adhered together, each ceramic substrate having one or more conductive traces defined thereon;
   wherein the one or more conductive traces are formed through consolidation of metal nanoparticles; and
   wherein the one or more conductive traces in a first ceramic substrate layer are in electrical communication with at least one second ceramic substrate layer adjacent thereto;
   wherein one or more through-plane vias extend through the ceramic substrate, the one or more through-plane vias being filled with a conductive material;
   wherein the conductive material comprises a metal plug formed by consolidating metal nanoparticles within the one or more through-plane vias; and wherein the metal nanoparticles are consolidated to form the one more conductive traces and the metal plug within the one or more through-plane vias at substantially the same time.

10. The multi-layer printed circuit board of claim 9, wherein the one or more conductive traces are defined upon a surface plane of the ceramic substrate, in a groove defined upon the ceramic substrate, or any combination thereof.

11. The multi-layer printed circuit board of claim 9, wherein at least a portion of the through-plane vias establish electrical communication between adjacent ceramic substrate layers.

12. The multi-layer printed circuit board of claim 9, wherein the metal nanoparticles comprise copper nanoparticles.

13. The multi-layer printed circuit board of claim 9, wherein a non-printed electronic component is disposed upon a surface plane of the ceramic substrate or within a groove or cavity upon the ceramic substrate, the non-printed electronic component being in electrical communication with one or more conductive traces upon at least one ceramic substrate layer.

14. The multi-layer printed circuit board of claim 13, wherein the non-printed electronic component is disposed upon the surface plane of the ceramic substrate and bridges a gap extending between a first portion and a second portion of at least one conductive trace.

15. The multi-layer printed circuit board of claim 13, wherein the non-printed electronic component is disposed upon the surface plane of the ceramic substrate forming the first ceramic substrate layer and is housed within a groove or cavity defined upon the ceramic substrate forming an adjacent ceramic substrate layer.

16. The multi-layer printed circuit board of claim 9, wherein the one or more conductive traces are formed upon an adhesive layer or a bonding layer in contact with the ceramic substrate.

\* \* \* \* \*